United States Patent
Zhang et al.

(10) Patent No.: US 9,490,794 B1
(45) Date of Patent: Nov. 8, 2016

(54) DYNAMIC SHUTDOWN PROTECTION CIRCUIT

(71) Applicant: Avago Technologies General IP (Singapore) Pte. Ltd., Singapore (SG)

(72) Inventors: Bin Zhang, Singapore (SG); Mei Zhen Choo, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 42 days.

(21) Appl. No.: 14/692,567

(22) Filed: Apr. 21, 2015

(51) Int. Cl.
| | |
|---|---|
| *H03B 1/00* | (2006.01) |
| *H03K 3/00* | (2006.01) |
| *H03K 17/082* | (2006.01) |
| *H03K 17/567* | (2006.01) |

(52) U.S. Cl.
CPC ........ *H03K 17/0828* (2013.01); *H03K 17/567* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 4,607,249 | A * | 8/1986 | Naylor | H03F 3/3096 341/135 |
| 5,255,240 | A * | 10/1993 | Wong | G11C 8/08 327/108 |
| 5,786,713 | A * | 7/1998 | Koyama | H03K 7/02 327/108 |
| 2014/0340124 | A1* | 11/2014 | Hirler | H03K 17/168 327/108 |
| 2016/0079401 | A1* | 3/2016 | Zhang | H01L 29/7393 361/57 |
| 2016/0124037 | A1* | 5/2016 | Zhang | G01R 31/2608 324/762.08 |

OTHER PUBLICATIONS

Onozawa et al., "Great Improvement in Turn-On Power Dissipation of IGBTs with an Extra Gate Charging Function", Proceedings of the 17th International Symposium Power Semiconductor Devices & IC's, May 2005, 4 pages.
Wang et al., "A di/dt Feedback Based Active Gate Driver for Smart Switching and Fast Overcurrent Protection of IGBT Modules", IEEE, 2013, 13 pages.

* cited by examiner

*Primary Examiner* — Adam Houston (57) ABSTRACT

Systems, circuits, and methods for operating an Insulated-Gate Bipolar Transistor (IGBT) are provided. A switching circuit is described that includes a first current path and a second current path. The first current path carries current away from the gate of the IGBT during a first phase of switching and the second current path carries current away from the gate of the IGBT during a second phase of switching.

20 Claims, 7 Drawing Sheets

DYNAMIC SHUTDOWN PROTECTION CIRCUIT

FIELD OF THE DISCLOSURE

The present disclosure is generally directed toward IGBT driver circuits.

BACKGROUND

The Insulated-Gate Bipolar Transistor (IGBT) is a three-terminal power semiconductor device primarily used as an electronic switch and in newer devices is noted for combining high efficiency and fast switching. It switches electric power in many modern appliances such as: Variable-Frequency Drives (VFDs), electric cars, trains, variable speed refrigerators, lamp ballasts, air-conditioners, and even stereo systems with switching amplifiers.

IGBTs are often used for high voltage (e.g., greater than 600V) and high-current power converter applications. During normal switching, in order to achieve overall system efficiency, one has to keep the IGBT high current/high voltage switching energy loss to a minimum and the Miller Plateau short. To achieve these goals, one has to drive the IGBT hard, using a small gate resistor and/or external buffer circuit. While doing this, the peak collector-to-emitter voltage of the IGBT may exceed its absolute maximum rating. This means that a protection circuit is required to protect the IGBT from damage.

Furthermore, during short-circuit conditions, for example a short circuit of the load wire to the power source, large current flows through the IGBT, thereby damaging the IGBT. Gate drive circuits are used to detect IGBT short circuit conditions and trigger the turn-off of the IGBT safely to prevent further damage to the IGBT.

Figure 1:
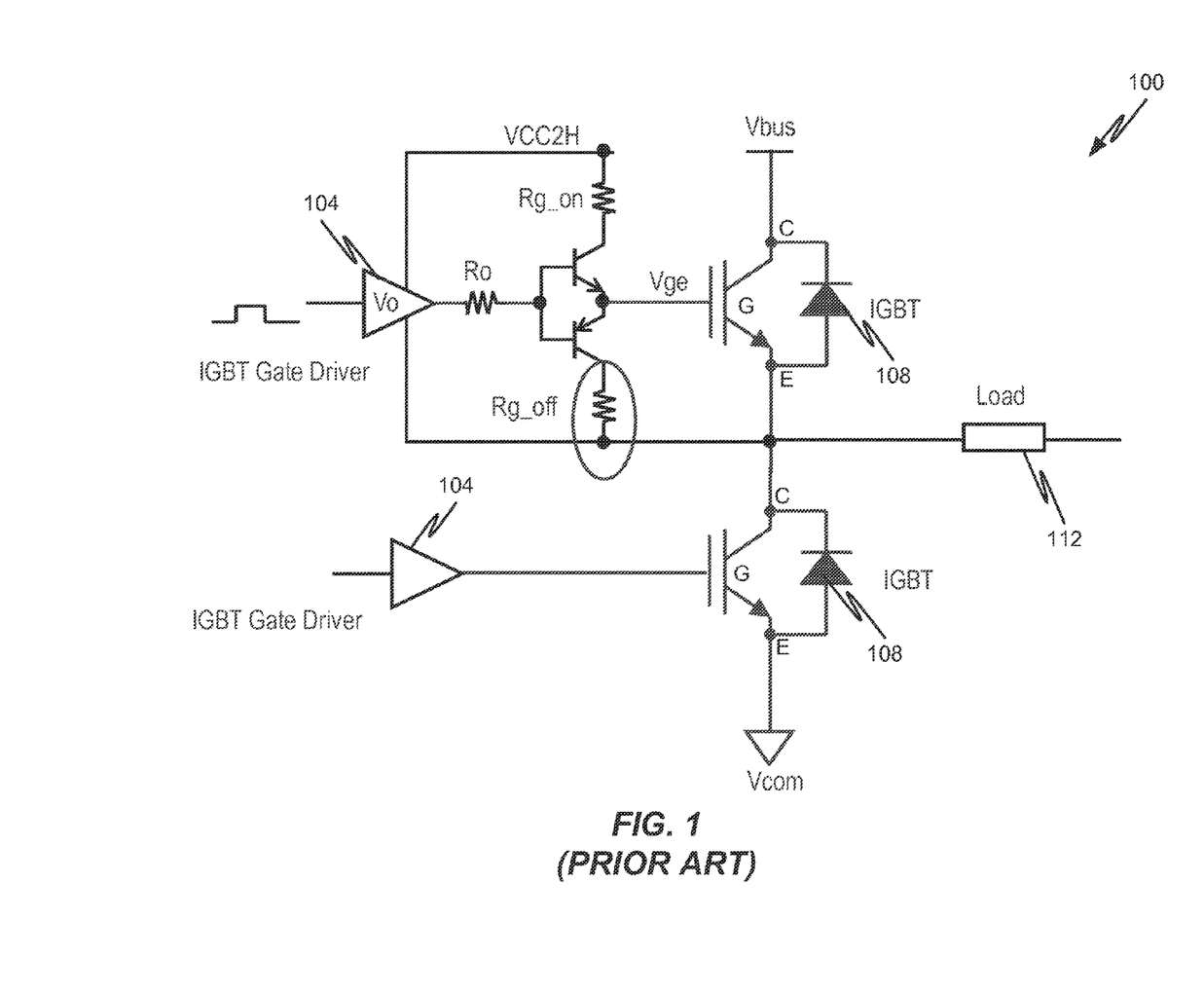
FIG. 1 is a circuit diagram depicting a first prior art circuit.

In order to keep the collector-to-emitter voltage of the IGBT less than its absolute maximum rating during high-current turn-off, one straight forward solution is to slow down the turn-off using a relatively large resistor. A common IGBT drive circuit 100 without short-circuit protection is shown in FIG. 1 where a load 112 is driven by current from IGBTs 108, which are in turn driven by gate drivers 104. The depicted circuit 100 is often referred to as a half-bridge circuit and is among the most important circuit configurations for power drives. The circuit 100 is shown to include two IGBTs 108 connected to one another at the circuit's 100 midpoint and the load 112 is connected to this midpoint. The midpoint corresponds to a circuit node where an emitter E of one IGBT 108 is connected to a collector C of another IGBT 108.

Problematically, as shown in FIG. 1, if the circuit 100 experiences a short (e.g., between Ground/common voltage and the circuit's 100 midpoint) then excessive current will flow through the top IGBT 108, most likely resulting in damage to the IGBT 108. As shown in FIG. 1, the first circuit 100 is shown to include resistor Rg_off, which is used to slow down the turn-off time for the IGBT 108. However, the problem with slowing down the turn-off time is the energy losses are increased and the Miller Plateau is lengthened, thereby reducing the overall efficiency of the system. Furthermore, by increasing the turn-off time, there is an increased likelihood that short-circuit conditions may occur for a longer amount of time before they can be detected, thereby resulting in catastrophic damage to the IGBT.

To address the problems of circuit 100, (e.g., high energy loss, long Miller Plateau, etc.), one can use a fast shutdown with the help of a protection circuit. Fast shutdown can help to keep the turn-off energy losses to a minimum, shorten the Miller Plateau, and meet shutdown system dead time requirements. However, turning off the IGBT too fast during high current conditions will result in high peak collector-to-emitter voltage of the IGBT 108, which could damage the IGBT 108.

Figure 2:
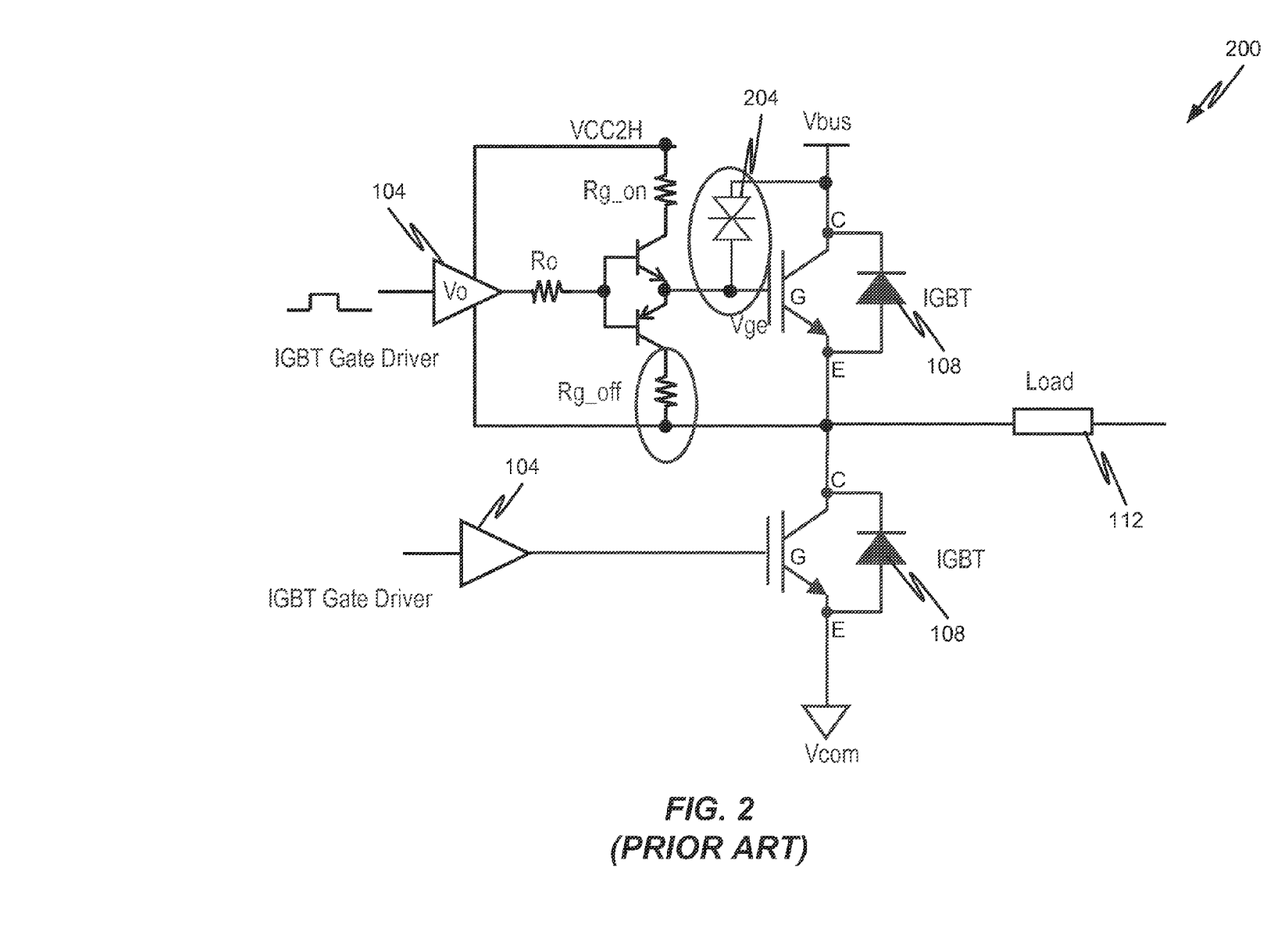
FIG. 2 is a circuit diagram depicting a second prior art circuit.

FIG. 2 depicts another circuit 200 that includes a protection circuit as described above. In particular, circuit 200 is shown to include an additional Transient Voltage Suppressor (TVS) 204 or clamping diode positioned between the collector C and gate G of the IGBT, to prevent IGBT breakdown. When the collector-to-emitter voltage of the IGBT 108 exceeds the TVS 204 breakdown voltage, the IGBT is turned on again to clamp the collector-to-emitter voltage.

While the TVS 204 works well to protect the IGBT 108 from collector-to-emitter overvoltage, the implementation of the TVS 204 reduces the effective working voltage of the IGBT 108. For the same application, higher voltage IGBTs have to be used, which increases the overall system costs and reduces the system efficiency.

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated driver circuits of the prior art.

While embodiments of the present disclosure will primarily be described in connection with driver circuits for IGBTs or circuits containing IGBTs, it should be appreciated that embodiments of the present disclosure are not so limited.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

In accordance with at least some embodiments, a dynamic shutdown circuit or circuits will be described that provide flexibility for circuit tuning based on users' application conditions. For example, users can tune their circuit separately to achieve fast shutdown in a first phase and then slow shutdown in a second phase. Benefits of the dynamic shutdown circuits and methods described herein for each phase are many. For instance, during the first phase, the fast shutdown is enabled that keeps the Miller Plateau short, thereby minimizing energy losses and lowering the peak short-circuit current flowing through an IGBT during short circuit conditions. During the second phase, a slow shutdown is enabled to keep the peak collector-to-emitter voltage of the IGBT low without the need for an active clamping diode or TVS. Elimination of the active clamping diode or TVS helps to avoid introducing inefficiencies to the system (e.g., by requiring an IGBT with a higher working voltage).

As will be discussed in further detail herein, the dynamic shutdown can be divided into two distinct phases. In the first phase of dynamic shutdown, a fast initial discharge from and IGBT gate through a resistor and a capacitor occurs. This is a strong pull down as resistor having the initial current flow therethrough is relatively small and the capacitor is initially behaving like a short or wire. This fast shutdown determines the Miller Plateau and helps to keep the turn off energy losses to a minimum.

After the initial strong pull, the capacitor is eventually charged to a level that can support and hold the gate-to-emitter voltage of the IGBT for the second phase of the dynamic shutdown. During the second phase of shutdown, the capacitor is discharged through a second resistor that was not initially receiving current during the first phase. In some embodiments, the size of the second resistor is larger (e.g., magnitudes larger) than the size of the first resistor. This time constant determines the peak collector-to-emitter voltage during the shutdown.

It should be appreciated that the concepts described herein can be applied to both normal shutdown scenarios as well as short-circuit scenarios.

Figure 3:
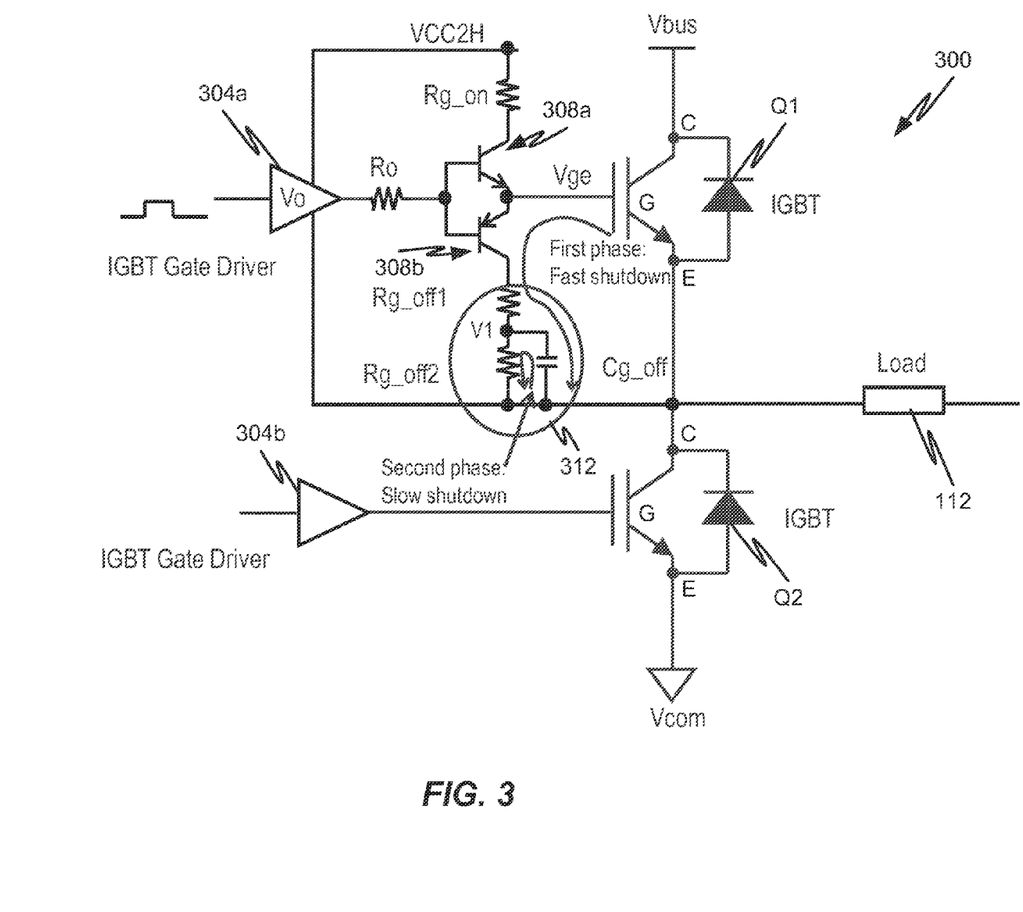
FIG. 3 is a circuit diagram depicting a first dynamic shutdown circuit in accordance with at least some embodiments of the present disclosure.
Figure 4:
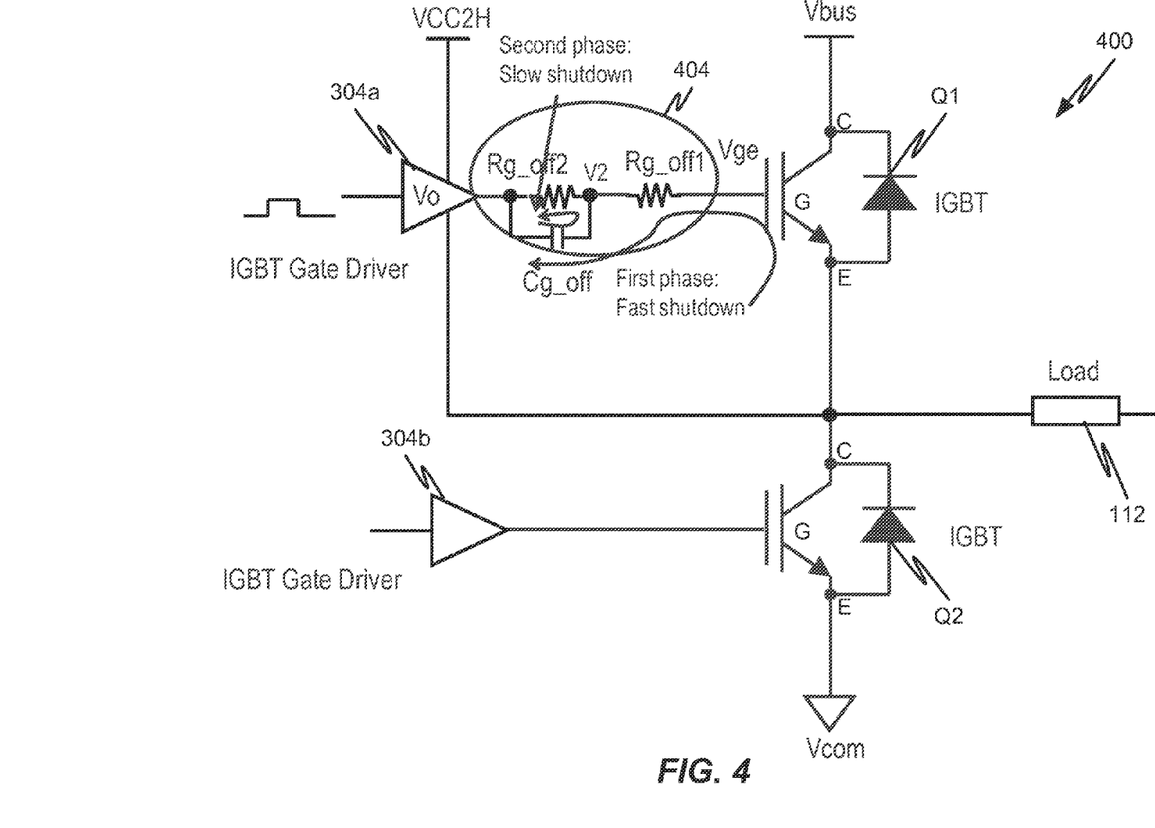
FIG. 4 is a circuit diagram depicting a second dynamic shutdown circuit in accordance with at least some embodiments of the present disclosure.

With reference now to FIGS. 3 and 4 two shutdown circuits 300, 400 used as part of an IGBT driver circuit will be described in accordance with at least some embodiments of the present disclosure. As can be appreciated, concepts from one circuit can be applied to the other circuit and vice versa. A commonality between the circuits 300, 400 is that both circuits can implement a dynamic shutdown of an IGBT without requiring an active clamping diode or TVS. Another commonality between the circuits 300, 400 is that both circuits are configured to operate in two distinct phases: (1) a fast shutdown phase followed by (2) a slowed shutdown phase.

With reference initially to FIG. 3, a first shutdown circuit 300 will described in accordance with at least some embodiments of the present disclosure. The circuit 300 is shown to include one or more IGBTs having a collector, gate, and emitter. A first driver 304a is used to provide a driving current to the gate of the first IGBT Q1. A second driver 304b is used to provide a driving current to the gate of the second IGBT Q2. As can be appreciated, the emitter of the first IGBT Q1 may be connected to a collector of a second IGBT Q2, such that the circuit 300 has a half-bridge configuration. In fact, the circuit 300 only depicts first and second IGBTs Q1, Q2 but embodiments of the present disclosure may utilize a circuit 300 with more than two IGBTs.

The circuit 300 is also shown to include a turn-on resistor Rg_on, a plurality of switching elements 308a, 308b, and a turn-off circuit 312. The turn-off circuit 312 may also be referred to herein as a shutdown circuit or the like. The components of the turn-off circuit 312 are connected between the gate G of the first IGBT Q1 and the emitter E of the first IGBT Q1. It may also be considered that the turn-off circuit 312 is connected between the gate G of the first IGBT Q1 and the load 112.

The turn-off circuit 312 is shown to include a pair of turn-off resistors (e.g., a first turn-off resistor Rg_off1 and a second turn-off resistor Rg-off2). The turn-off circuit 312 is further shown to include a turn-off capacitor Cg_off. In the depicted embodiment, the turn-off capacitor Cg_off is connected in parallel with the second turn-off resistor Rg_off2 and in series with the first turn-off resistor Rg_off1. Likewise, the first and second resistors Rg_off1 and Rg_off2 are also shown to be connected in series with one another.

The configuration of the turn-off circuit 312 is such that two current paths are created within the turn-off circuit 312. A first current path corresponds to a path that carries current away from the gate G of the first IGBT Q1 during a first phase of switching. Current flowing through the first current path corresponds to current generated by the gate G of the first IGBT Q1 discharging. In the depicted embodiment, the first current path corresponds to a path that includes the first turn-off resistor Rg_off1 and the turn-off capacitor Cg_off. During the first phase of shutdown, current flows through the first current path because the turn-off capacitor Cg_off is initially not charged and behaves like a short or a wire. Thus, current flowing from the gate G of the first IGBT Q1 flows through the first current path as it is the path of least resistance. In some embodiments, the first phase of switching is considered a fast shutdown as the first turn-off capacitor Rg_off1 is relatively small and the turn-off capacitor Cg_off is behaving like a short or wire. This fast shutdown determines the Miller Plateau length and helps to keep the turn-off energy losses to a minimum.

After the initial strong pull of the first phase, the turn-off capacitor Cg_off becomes charged to a level that can support and hold the gate-to-emitter voltage for the second phase of shutdown—a slower shutdown phase. In the second phase, current stops flowing through the first current path due to the turn-off capacitor Cg_off becoming charged and now behaving like an open circuit. This causes current to instead flow through a second current path of the turn-off circuit 312, which includes the first turn-off resistor Rg_off1 and the second turn-off resistor Rg_off2. As current flows through the second current path, the second phase of shutdown occurs. During the second phase of shutdown, the turn-off capacitor Cg_off is also discharged through the second turn-off resistor Rg_off2. The time constant determined by the amount of time needed for the turn-off capacitor Cg_off to discharge also determines the peak collector-to-emitter voltage of the first IGBT Q1.

The sizes of components in circuit 300 can vary without departing from the scope of the present disclosure. As an example, the size of the second turn-off resistor Rg_off 2 can be larger than the size of the first turn-off resistor Rg_off1. As an example, the first turn-off resistor Rg_off1 may vary from 1 ohm to 5 ohms and more particularly may be about 2.5 ohms. The second turn-off resistor Rg_off2 may vary from 10 ohms to 100 ohms and more particularly may be about 50 ohms (e.g., twenty times larger than the first turn-off resistor Rg_off1). This variation in size enables the first phase of shutdown to have a strong pull down. The turn-off capacitor Cg_off may vary from 10 nF to 100 nF and more particularly be about 50 nF. The turn-on resistor Rg_on may vary from 1 ohm to 5 ohms and more particularly be about 2.5 ohms. The resistor at the output of the first driver 304a Ro may vary from 10 ohms to 100 ohms and more particularly be about 50 ohms.

In some embodiments, the switches 308a, 308b may correspond to optional components; however, in operation the switches 308a, 308b can be used to facilitate operation of the circuit 300. More specifically, the switches 308a, 308b may correspond to a pair of Field Effect Transistors (FETs) or a similar switching component.

With reference now to FIG. 4, an alternative dynamic shutdown circuit 400 will be described in accordance with at least some embodiments of the present disclosure. The circuit 400 may include a turn-off circuit 412, similar to turn-off circuit 312. The turn-off circuit 412 in the embodiment of FIG. 4 is shown to be connected between an output of the first driver 304a and the gate G of the first IGBT Q1. Similar to turn-off circuit 312, the turn-off circuit 412 may comprise a first turn-off resistor Rg_off1, a second turn-off resistor Rg_off2, and a turn-off capacitor Cg_off. The components of the turn-off circuit 412 may be similar to turn-off circuit 312 and may create first and second current paths to accommodate a first and second phase of the dynamic shutdown for the IGBT Q1. The sizes of components in the turn-off circuit 412 may be similar or identical to the sizes of components in the turn-off circuit 312.

Advantageously, both circuits 300, 400 enable a two-phase dynamic shutdown without the need for an active clamping diode. Both phases may be used turn normal switching of the IGBT or to respond to short-circuit events.

Figure 5:
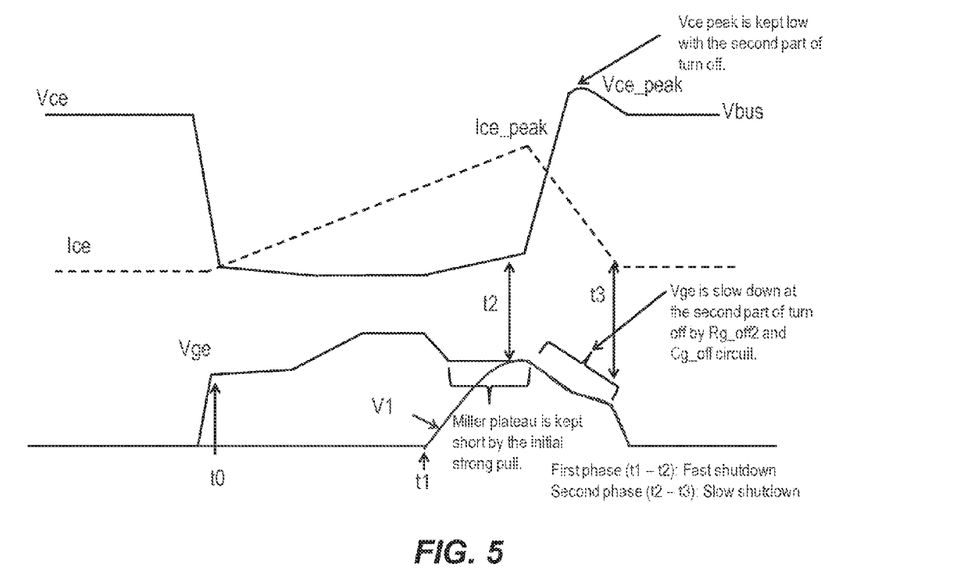
FIG. 5 is a timing diagram depicting current and voltage waveforms produced in the circuit of FIG. 3 during normal dynamic shutdown in accordance with embodiments of the present disclosure.
Figure 6:
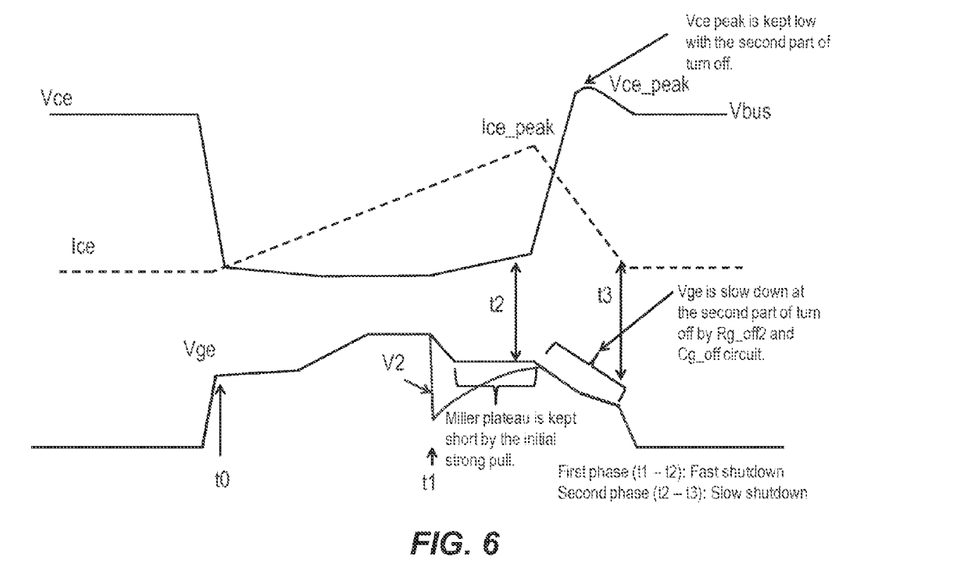
FIG. 6 is a timing diagram depicting current and voltage waveforms produced in the circuit of FIG. 4 during normal dynamic shutdown in accordance with embodiments of the present disclosure.

With reference now to FIGS. 5-8, various waveforms showing the operation of both circuits 300, 400 will be described in accordance with at least some embodiments of the present disclosure. It should be appreciated that the waveforms are not necessarily drawn to scale. FIGS. 5 and 6 depict operation of circuits 300 and 400, respectively, when normal switching occurs. As can be seen in FIGS. 5 and 6, both circuits 300 and 400 enable the Miller Plateau to be kept relatively short by the initial strong pull of the first phase of shutdown (e.g., between time t1 and time t2). Both circuits 300 and 400 are also able to keep the peak collector-to-emitter voltage of the IGBT low with the second phase of shutdown (e.g., between time t2 and time t3). It can also be seen that the gate-to-emitter voltage of the IGBT is slowed down due to the discharge of the turn-off capacitor Cg_off through the second turn-off resistor Rg_off2.

Figure 7:
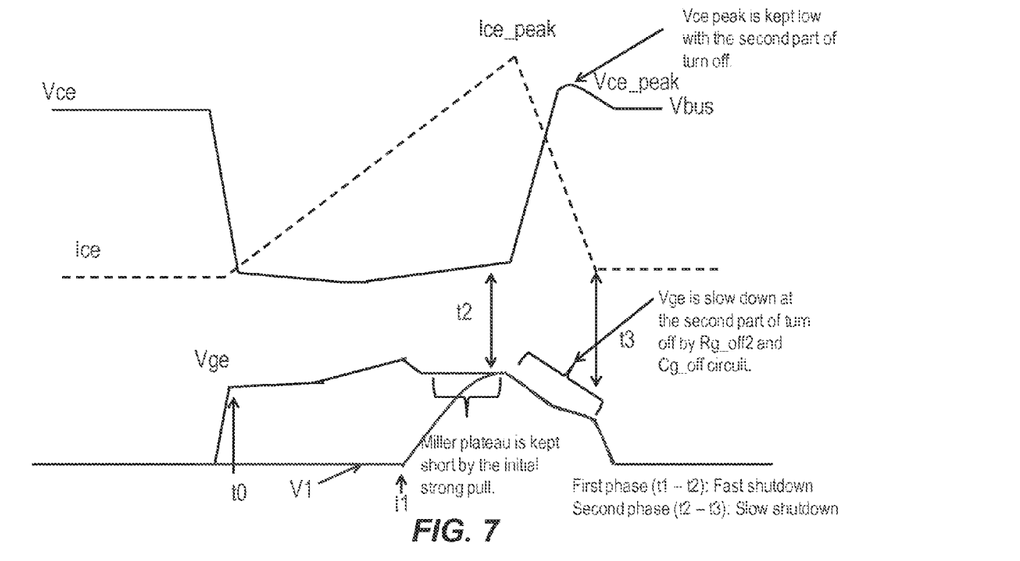
FIG. 7 is a timing diagram depicting current and voltage waveforms produced in the circuit of FIG. 3 during a short-circuit dynamic shutdown in accordance with embodiments of the present disclosure.
Figure 8:
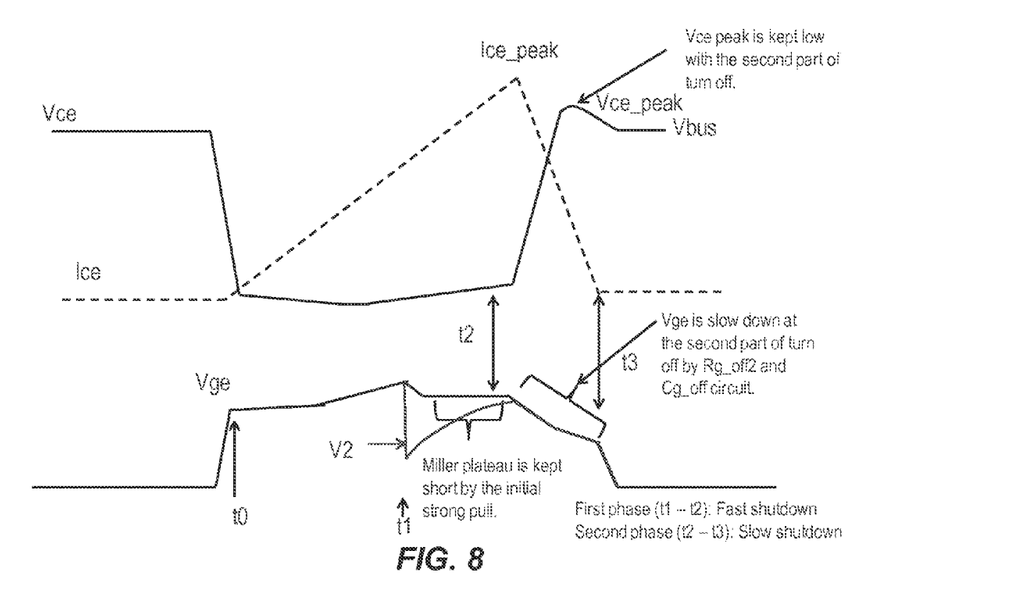
FIG. 8 is a timing diagram depicting current and voltage waveforms produced in the circuit of FIG. 4 during a short-circuit dynamic shutdown in accordance with embodiments of the present disclosure.

FIGS. 7 and 8 depict operation of circuits 300, 400, respectively, when a short-circuit event occurs. As can be seen in FIG. 7, the voltage at node V1 (e.g., between the first turn-off resistor Rg_off1 and second turn-off resistor Rg_off2) is controlled during both the first and second phases of shutdown in response to a short-circuit event. Again, the shutdown occurs in two phases to keep the peak collector-to-emitter voltage within operating tolerances of the IGBT and then to keep the discharge of current from the emitter of the IGBT under control.

Figure 9:
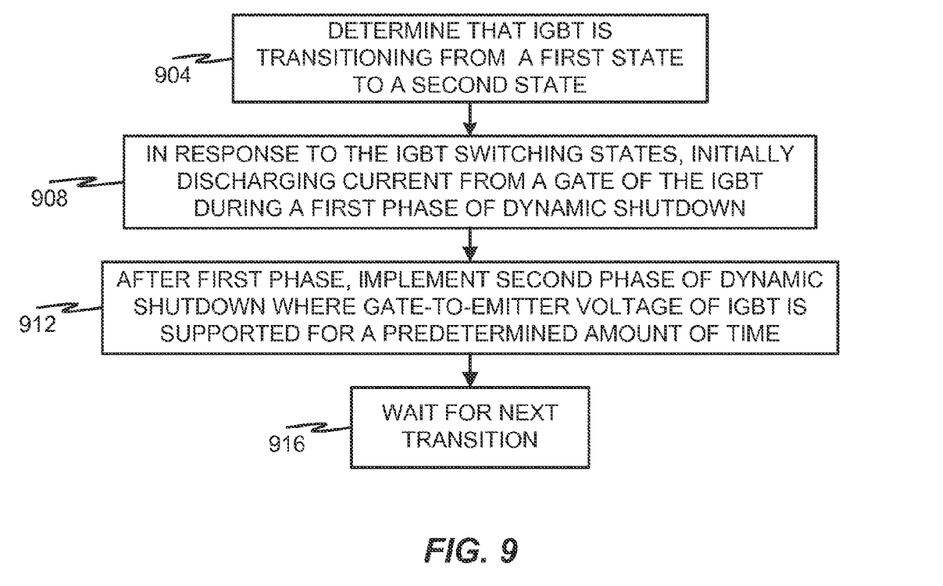
FIG. 9 is a flow diagram depicting a method of operating a dynamic shutdown circuit in accordance with embodiments of the present disclosure.

With reference now to FIG. 9, an illustrative method for operating a dynamic shutdown circuit (e.g., circuit 300 or 400) will be described in accordance with at least some embodiments of the present disclosure. The method may be utilized to respond to either normal switching events or to respond to short-circuit events in an IGBT driver circuit.

The method begins by determining than an IGBT is transitioning from a first state to a second state (step 904). In some embodiments, the first state may correspond to a state where the IGBT is ON and the second state may correspond to a state where the IGBT is OFF. Thus, the transition identified in step 904 may correspond to a transition where the IGBT is switching off.

In response to the IGBT switching states, the method continues by initially discharging current from a gate of the IGBT during a first phase of dynamic shutdown (step 908). As discussed herein above, current discharged from the gate of the IGBT may travel through a first current path of a turn-off circuit during this first phase of shutdown. In some embodiments, the current travels through at least one turn-off resistor and at least one turn-off capacitor.

After the first phase has completed, the method continues by implementing a second phase of dynamic shutdown where the gate-to-emitter voltage of the IGBT is supported for a predetermined amount of time by the now-charged turn-off capacitor (step 912). In some embodiments, current flowing from the gate of the IGBT now flows through a second current path of a turn off-circuit which includes at least two turn-off resistors. This second phase of shutdown continues until the IGBT has completed its transition from the first state to the second state. If the transition occurred during a normal switching of the IGBT, then the method will continue to wait for a next transition (step 916). If a short-circuit event occurred during the shutdown, then the method may wait until remedial actions are taken to address the short-circuit event before waiting for the next transition.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
   at least one Insulated-Gate Bipolar Transistor (IGBT) having a gate, collector, and emitter;
   a first driver for the at least one IGBT, the first driver configured to provide a driving current to the gate of the IGBT;
   a load connected to the emitter of the at least one IGBT; and a turn-off circuit connected between the gate of the IGBT and the first driver, the turn-off circuit being configured to dynamically shut down current flowing through the IGBT in the absence of a clamping diode.

2. The circuit of claim 1, wherein the turn-off circuit operates in two phases, wherein during a first of the two phases the turn-off circuit implements a fast initial discharge from the gate.

3. The circuit of claim 2, wherein the fast initial discharge controls a Miller plateau of the IGBT.

4. The circuit of claim 3, wherein during a second phase of the two phases the turn-off circuit holds a gate-to-emitter voltage of the IGBT at a predetermined value for a predetermined amount of time that determines a peak collector-to-emitter voltage of the IGBT.

5. The circuit of claim 4, wherein the first phase and second phase are applied during short-circuit events.

6. The circuit of claim 4, wherein the first phase and the second phase are applied during normal switching events as well as short-circuit events for the IGBT.

7. The circuit of claim 4, wherein current flow through a capacitor during the first phase and wherein the capacitor becomes fully charged the second phase begins until the first driver is turned off.

8. The circuit of claim 1, wherein the turn-off circuit comprises a first resistor connected in parallel with a capacitor between the gate of the IGBT and the emitter of the IGBT.

9. The circuit of claim 8, wherein the turn-off circuit further comprises a second resistor that is connected in series with the first resistor and capacitor.

10. The circuit of claim 1, wherein the turn-off circuit comprises a first resistor connected in parallel with a capacitor between the gate of the IGBT and an output of the driver.

11. The circuit of claim 10, wherein the turn-off circuit further comprises a second resistor that is connected in series with the first resistor and capacitor.

12. An Insulated-Gate Bipolar Transistor (IGBT) switching circuit configured to dynamically shut down the IGBT during normal switching and/or short-circuit events, wherein the IGBT comprises a gate, collector, and emitter, wherein the IGBT is driven by a driver, and wherein the switching circuit comprises:
    a first current path that carries current away from the gate of the IGBT during a first phase of switching in which the gate of the IGBT is discharged through a primary resistor and a capacitor; and
    a second current path that carries current away from the gate of the IGBT during a second phase of switching in which the capacitor is fully charged but the IGBT is still carrying current from the collector to the emitter, wherein during the second phase current does not flow through the capacitor but instead flows through the primary resistor and another resistor connected in parallel with the capacitor.

13. The switching circuit of claim 12, wherein the first current path and second current path both flow from the gate of the IGBT to the driver.

14. The switching circuit of claim 12, wherein the first current path and second current path both flow from the gate of the IGBT to the emitter of the IGBT.

15. The switching circuit of claim 12, wherein the resistor connected in parallel with the capacitor is at least twice as large as the primary resistor.

16. The switching circuit of claim 12, wherein the first and second current paths are used during normal switching events and short-circuit events.

17. The switching circuit of claim 12, further comprising a switching transistor connected between the gate of the IGBT and the first and second current paths.

18. A method of operating an Insulated-Gate Bipolar Transistor (IGBT) switching circuit, the method comprising:
    determining that the IGBT is switching between a first operational state and a second operational state;
    in response to the IGBT switching from the first operational state to the second operational state, initially discharging current from a gate of the IGBT during a first phase of dynamic shutdown;
    following the first phase of dynamic shutdown, implementing a second phase of dynamic shutdown during which a gate-to-emitter voltage of the IGBT is supported for a predetermined amount of time that controls a collector-to-emitter voltage of the IGBT during switching from the first operational state to the second operational state.

19. The method of claim 18, wherein the first operational state corresponds to an ON state and wherein the second operational state corresponds to an OFF state.

20. The method of claim 18, wherein current flows through a shut-down capacitor during the first phase and current is substantially prohibited from flowing through the shut-down capacitor during the second phase.

* * * * *